US006757751B1

(12) United States Patent
Gene (10) Patent No.: US 6,757,751 B1
(45) Date of Patent: Jun. 29, 2004

(54) HIGH-SPEED, MULTIPLE-BANK, STACKED, AND PCB-MOUNTED MEMORY MODULE

(76) Inventor: Harrison Gene, 4378 Enterprise St., Fremont, CA (US) 94538

( * ) Notice: Subject to any disclaimer, the term of this patent is extended or adjusted under 35 U.S.C. 154(b) by 706 days.

(21) Appl. No.: 09/637,986

(22) Filed: Aug. 11, 2000

(51) Int. Cl.[7] .................................................. G06F 3/00
(52) U.S. Cl. .......................... 710/36; 710/43; 710/100; 711/145; 439/101
(58) Field of Search .............................. 710/2, 3, 7, 36, 710/40, 41, 43, 62, 72, 100; 711/111, 145; 439/101, 267

(56) References Cited

U.S. PATENT DOCUMENTS

| | | | | |
|---|---|---|---|---|
| 5,281,842 A | * | 1/1994 | Yasuda et al. | 257/371 |
| 5,379,416 A | * | 1/1995 | Taskishima | 395/575 |
| 5,633,812 A | * | 5/1997 | Allen et al. | 364/578 |
| 5,769,645 A | * | 6/1998 | Martin et al. | 439/79 |
| 5,791,916 A | * | 8/1998 | Scirbl et al. | 439/6.1 |
| 5,887,158 A | * | 3/1999 | Sample et al. | 395/500 |
| 6,309,237 B1 | * | 10/2001 | Longueville | 439/267 |
| 6,431,886 B1 | * | 8/2002 | Ramey et al. | 439/101 |

\* cited by examiner

*Primary Examiner*—Rehana Perveen
*Assistant Examiner*—Rijue Mai (57) ABSTRACT

The density for any generation of Standard In-Line Memory Module (SIMM), or Dual In-Line-Memory Module (DIMM), chipset used to provide computer Random Access Memory (RAM), can be multiplied by surface-mounting multiple banks of SIMMs or DIMMs, where each bank occupies one side of a printed-circuit board (PCB) and at least a second PCB is connected to a first PCB, which is in turn connected through the standard edge connectors to the bus, with the banks connected through shared and controlled input-and-output lines, and wherein a single standard controller directs address-oriented storage to the corresponding portion of the stacked and connected banks.

6 Claims, 5 Drawing Sheets

Fig. 3 I/O Pin layout (Idea 1)

Fig. 4 I/O Pin layout (Idea 2)

Fig. 5 I/O Pin layout (Idea 3)

HIGH-SPEED, MULTIPLE-BANK, STACKED, AND PCB-MOUNTED MEMORY MODULE

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of the Invention

A computer system needs memory to store instructions and data that are processed by the central processing unit (CPU). In a typical computer, the CPU communicates with the memory via a bus, that sets a limit on the amount of parallel information (width) that can move in a single time unit. Memory comes in special chips known as DRAM (dynamic random access memory), which are packaged together in industry-standard modules. The chips are arranged in a line on a printed circuit board (PCB), with the memory chips either on a single side (SIMM, or Single In-Line Memory Module) or on both sides (DIMM, or Dual In-Line Memory Module). There are industry-standard machines for connecting memory chips to a board and then soldering the connections between the chips' input/output (I/O) pins and the metal circuits printed on the board, because the cost and yield respectively increase and decrease when the same work is done by hand, even by skilled (yet thus more expensive) labor. The size of the memory chip on a SIMM or DIMM has become standardized to increase the manufacturability and lower the cost of the completed memory module. A memory module PCB, also known as a 'memory bank', will have a set of connectors between its on-board circuitry and the computer system bus additionally, it often has subordinate governing and special logic circuits to help manage the U/O flow between the memory module and the rest of the computer system.

There are two goals that designers, manufacturers, and users of memory modules strive for While the amount of memory that can be stored on a single memory chip has been increasing steadily the amount of memory necessary for smooth and fast operation of a computer system has also been increasing. Individual memory banks have gone through several generations in the past decade alone, moving from 8 megabytes to 16 megabytes to 32 megabytes to 64 megabytes per module, with 128 megabyte modules on the commercial horizon. Over roughly the same time, however, the minimum system RAM for a normal personal computer (PC) has shifted from 640K to 65MB. So one goal is to maximize, for the capacity of a given generation of memory chip, the total amount of memory that can be contained on a memory bank, when the memory bank is a SIMM (or DIMM) incorporating a number of such memory chips, within the same geometric limits for the memory banks.

At the same time that the amount of memory desired has increased, the price for memory has decreased (almost exponentially), just as the price paid for a given power computer has also decreased. This has created some unpleasant trade-offs for computer manufacturers, and for memory bank manufacturers. For the same amount of memory each year they will get less money, meaning that they constantly need ways to provide more memory for less cost. For this reason, anything that increases the manufacturing yield of a memory bank with a particular memory capacity, find anything that decreases the cost of manufacturing a memory bank, is a useful and valuable advance. Thus, decreasing the density of on-board circuitry for a memory bank necessary to provide memory capacity is a desirable result, since it decreases the cost and increases the yield of production of such. Two design elements that increase the cost, and decrease the yield, of producing a memory bank are, first, increasing the number of pin connectors needed to attain a given number of I/O connections between the memory bank and the bus; and second, requiring manual assembly and soldering of a given number of pin connections between the memory chips and the PCB the memory bank. The more pins that must be connected, the fewer banks can be manufactured in a given amount of time, and the lower the manufacturing yield will be (since there are that many more chances for a pin connection to be inaccurately made). If the number of connections required can be cut by a significant percentage, then the overall productivity for a given memory bank capacity will be increased.

Technological advances are costly to implement, and for certain implementations it is desirable to use less costly technology interchangeably with system configurations which can use higher technology. For example, sometimes it is desirable to use 16-meg chips with systems that support 64-meg technology. In such a configuration, a 64 or 72 bit wide data bus using 64-megabit (8M times 8) chips can be used. If the system is designed for 8M times 8 chips, the JEDEC standard is for a 12 times 11 address scheme (i.e., 12 row address bits and 11 column address bits). In such a scheme, only one bank is required to read all 64 or 72 bits, and thus only a single RAS signal is needed. However, 64 megabit chips all utilize 3.3 volt technology which for several reasons is quite expensive and thus, while fewer chips can be used to store the same information, these fewer chips in the aggregate are more expensive than using 16 megabit chips manufactured in 5-volt technology. For example. 8, 8 times 8 chips can be used to store the same amount of information as is stored in 32, 4 times 4 chips. However, the 32 4 times 4 chips are much cheaper in the aggregate than the 8.8 times 8 chips, and thus for many applications, even though more chips are involved, it is desirable to use the 5-volt technology and 32, 4 times 4 chips. As a result, computer designers have struggled to increase the amount of memory accessible within a given physical format or module even though there has been a more costly alternative of increasing the memory bank's capacity by buying higher-priced but higher-capacity individual memory chips for that bank.

Moreover, bus limitations are now one of the bottleneck points to computer designs. The more that off-bus smarts can be designed into the memory bank, the less the load on the system for overhead, in managing memory addressing, becomes. A number of methods have already been designed to deal with part of this problem.

For example, a computer's memory typically includes one or more memory banks (or memory components) connected in parallel such that each memory component stores one set of data, such as a word or double word, per memory address. The memory controller communicates with, and interprets commands from, the CPU to the memory modules. For example, the CPU issues a command and an address which are received and translated by the memory controller. The memory controller, in turn, applies appropriate command signals and row and column addresses to the memory modules. Examples of such commands include a row address strobe (RAS), column address strobe (CTS), write enable (WEE), and possibly a clock signal (CLK). (The line or bar over the acronym for a symbol generally indicates, that the active state for the particular signal is a logical low value.) In response to the commands and addresses, data is transferred between the CPU and the memory modules. Each time a memory changing update instruction must be issued, however, the computer's cycle overhead is increased. Techniques that do not require the CPU to manage all details of memory storage decrease this overhead and thus indirectly increase performance; therefore, design elements of a memory bank that decrease the demand on the CPU to issue memory change updates indirectly increase performance.

Secondly, because the majority of program execution through the CPU is sequential in nature (operation 1, operation 2, operation 3 . . . , operation 50), program execution very often proceeds along a row of memory. When in page mode, the memory controller compares the row address of the memory location currently being accessed with the row address for the next memory access. If the row addresses are the same (known as a "page hit"), then the memory controller continues asserting the RAS control signal at the end of a current bus cycle. Because the memory already has the correct row address, the new column address can be immediately transferred to the memory without requiring a RAS/CAS delay. Design elements on memory banks that support an approach of automatically flowing along the memory addresses without requiring CPU activity or RAS/CAS delays, again decrease system overhead costs and thereby indirectly increase performance. Thirdly, methods that can use extended data out (EDO) DRAMs (which are faster) improve upon the FPM DRAMs. In FPM DRAMs, the CAS high-to-low transition latches the column address, while the CAS low-to-high transition turns off an output buffer of the RAM. EDO DRAMs instead separate the two functions of the CAS signal. The low-to-high transition of CAS no longer turns off the output buffer. This change provides an extended time during which the output data is valid, hence the "extended data out" name. EDO memory allows the CPU to sample the output data even while an address for a subsequent data transfer operation is being set up for the next read cycle. Any design method that supports a memory bank approach that allows further extension of this approach will be valuable.

Fourthly, Burst EDO (BEDO) DRAMs improve upon the good idea used in EDO DRAMs (leaving data valid even after CAS goes high). Most current CPUs typically access BEDO DRAMs in four-cycle bursts at four adjacent memory locations to fill a cache memory. Recognizing this typical access operation. BEDO DRAMs quickly provide the following three addresses itself after receiving the first address. BEDO DRAMs; typically include a two-bit counter which provides three column addresses after the first received column address. The memory controller, and CPU, thus avoid the tight timing requirements of providing multiple addresses at appropriate times to the DRAM device. As a result, a "dead" time occurring between the appearance of each bit, byte, word, set or "group" of valid data at the output pins of the BEDO DRAM device is reduced, as compared with respect to EDO and FPM DRAMs. For example, where an FPM DRAM requires an initial five clock cycles to provide a first data group, and three clock cycles for each of three subsequent data groups (i.e., "5-3-3-3 bursting"). BEDO DRAMs can provide bursting at rates of up to 5-1-1-1 or less. The longer that a 'burst' can be extended, the longer, of course, before the memory update instruction overhead is incurred. Memory bank design that supports such approaches will be valued.

Finally, an even faster form of DRAM is synchronous DRAM (SDRAM). FPM, EDO, and BEDO DRAM are asynchronous DRAM devices because they do not require a clock input signal. The memory controller for asynchronous devices receives the system clock signal and operates as a synchronous interface with the CPU so that data is exchanged with the CPU at appropriate edges of the clock signal. Memory controllers for SDRAM devices are necessarily simpler because the SDRAM devices and the CPU both operate based on a clock signal. To achieve optimum performance with a CPU, the SDRAM, device must be synchronized with the CPU. But the more memory that can be connected with the same clock device, the higher the SDRAM performance overall can be, again due to the decreased overhead.

As the speed of DRAM devices increase, other bottlenecks within computer systems arise. For example, as DRAM devices are operated at faster clock rates, the memory controllers to which they are coupled often cannot exchange data between the CPU and the memory device quickly, enough. Additionally, both BEDO DRAM and SDRAM devices required comparatively strict timing requirements compared to FPM and EDO DRAM devices. The strict timing requirements of BEDO DRAM requires a strict relation between generating an edge of CAS and when data is valid for reading or writing to the memory device. During each read cycle, CAS must fall during the middle of the period when data is to be read from the BEDO DRAM. For example, there is very little room for time delay or skew between the system clock and the CAS control signal supplied to the BEDO DRAM when the BEDO DRAM is operated in the 5-1-1-1 burst mode. As a result, designers must design their computer systems, or other applications, with minimum trace lengths on circuit boards to reduce propagation delays, and employ other methods to minimize skew between the system clock and command signals based on the clock. One memory controller chip set by Intel is believed to accommodate BEDO DRAM; however, such a chip set likely still requires the designer to be subject to the strict timing requirements of BEDO memory. Similarly, SDRAM devices require strict timing of data transfers with the SDRAM device in relation to the system clock signal. As a result of such strict requirements of BEDO DRAM and SDRAM devices, computer system designers and other users of DRAM devices have difficulty implementing such higher speed DRAM devices into their applications, despite the increased performance of such devices. As a result, system designers have accepted and employed lower speed DRAM devices in exchange for looser timing requirements in their designs, despite the speed and other benefits of BEDO and SDRAM devices. Another problem has been fitting the increasing density of memory within given physical constraints. A related problem has been providing memory within close enough physical location that timing difficulties, as detailed above, do not arise from greatly differing circuit lengths between differing memory banks. As the speed of memory access increases, this latter problem has worsened. As a result, designers must designs their computer systems, or other applications, with minimum trace lengths on circuit boards to reduce propagation delays, and employ other methods to minimize skew between the system clock and command signals based on the clock. With the new Burst Extended Data Out chips (BEDO), where memory access can automatically shift along more than one memory chip or module, comparatively strict timing (and thus circuit length) requirements exist.

Moreover, the denser the connecting lines between a memory bank and the bus, and between the PCB and the individual memory chips have to be, the greater the heat density, and the more difficult the manufacturability, of a particular memory bank becomes. The more that a design allows the memory banks to share I/O ports, the fewer pin connectors are required, decreasing manufacturing difficulty and cost, and increasing yield, for a given memory density.

The invention described below meets both of the goals mentioned above, and thus provides a significant advantage of the current state of the art for memory modules. First, for a given generation of memory chip, it doubles or quadruples the amount of memory that can be addressed in a single memory module using a single edge connector to the computer system bus, by allowing simultaneous access to a stepped fractional portion of the shared memory capacity aboard the module for each I/O operation or cycle, while requiring substantially less pin connectors for a given PCB. Instead of using 168 pins for a standard bank, it need only use 90 pins: and only half (32) the number of control connectors as on the standard approach (64), because the control connectors are shared between memory banks.

Secondly, because the control lines are, shared between banks, and thus only half the number are needed, the length of the lines is shortened between the I/O pins connecting to the system bus and the I/O pins connecting to the individual memory chips.

Thirdly, and again for a given generation of memory chip, the memory bank can be manufactured using industry-standard PCB assembly machinery rather than manual assembly to connect the memory chips' pins to the PCB. Because the banks are flexibly connected with supporting elements, the completed memory unit is sturdier and thus easier to use in further assembly onto the computer motherboard.

Fourthly, because the memory chips are mounted onto standard PCBs rather than directly on top of each other, the yield is increased. Instead of using 100 memory chips to produce 40 directly-double-stacked memory banks, 100 memory chips are used to produce 50 double-bank memory banks. Furthermore, the number of steps required is a quarter that for other memory-bank production methods using stacking technology.

Finally, because the method allows the usage of industry-standard, surface mount machinery for automated assembly onto standard PCBs, rather than requiring dual-pass or manual mount approaches, the manufacturing costs and yields are comparable to those of memory banks with half the given capacity, for a particular generation of memory chip.

2. Description of the Related Art

Various means to deal with the memory constraints have been provided. Some memory modules have built in memory delays which copy the CAS signal (as seen by the BEDO) to control memory. Others have built separate memory controllers to control the signals from the motherboard to the memory board. None of these have addressed the need for increased memory density in a given physical locality, i.e. in a particular, single memory card attached to the motherboard and bus of the personal computer.

The concept of a stackable memory card, as seen in U.S. Pat. No. 5,963,464 ignores two significant, and one less, problems which are solved by the subject of this application. First, in that patent the orientation of the initial memory bank must be horizontal, and there must be space above the motherboard sufficient to contain the entire stack of 'secondary' boards. Secondly, the additional wiring length (and distance) increases linearly with the addition of each memory card, which will create timing and control problems dependent upon the memory addressing used by the CPU. Finally, as the heat of the memory chips rises, there risk of chip failure from overheating increases with the addition of each stacked memory card.

The use of a Field Effect Transistor (FET) or other switching device to isolate- individual memory modules, and even memory chips, from each other on multiple-banks of memory in U.S. Pat. No. 5.953,215 addresses solely the desire to reduce the perceived capacitance and resistance from the presence of multiple memory chips. The switching devices in this invention require additional control signals out of the addressing methods to turn the switches on or off, and limit the memory throughput of the entire memory module to the lower limit set by the capacitance limit chosen by the module designer.

SUMMARY OF THE INVENTION

In the preferred embodiment of this invention at least two chipsets of industry-standard SIMM or DIMM RAM memory chips are first each mounted, using industry-standard surface mount technology, on a PCB with a chip and bank selecting controller chip, wherein the first bank contains an edge connector for linking the combined memory banks to the computer system, and the two banks share the data, address, and control lines from the edge connector to the memory chipsets. Address commands directed from the CPU are decoded to direct the memory I/O flow to the proper bank and row(s) to be addressed, with automatic updating through the capacity of, both banks to accommodate the programmed sequence. Burst lengths may be for 1, 2, 4 or 8, locations, or a full page, with a burst terminate option. Bank (i.e. column) addresses may be changed on each clock cycle to achieve a high-speed, fully random access. Moreover, while one bank is being addressed another, connected bank can be precharged to hide or eliminate the need for address update control information from the CPU. The PCBs are physically linked together by snap connectors which support the combination at four points, providing physical stability and adequate separation for heat dispersion from the memory chips. Because the banks are filled simultaneously (rather than serially), for a given address flow the number of row- or chip-change instructions will be reduced to the extent that multiple operations do not overflow the capacity, which is effectively doubled over that of a single bank. Because the distance between one bank and the next will be less than the distance along the bus between one module and the next, the time delay for addressing memory and the overall capacity within a given motherboard's layout will be decreased and increased respectively. Finally, because the two banks share addressing, control, and data lines (with the controller circuit coordinating the flow between the banks), the density of leads on each bank is reduced for a given memory capacity, thereby increasing the manufacturabilty, yield, and longevity of a module with a given memory capacity.

BRIEF DESCRIPTION OF THE DRAWINGS

These, and further features of the invention, may be better understood with reference to the accompanying specification and drawings depicting the preferred embodiment, in which.

DETAILED DESCRIPTION

Figure 1:
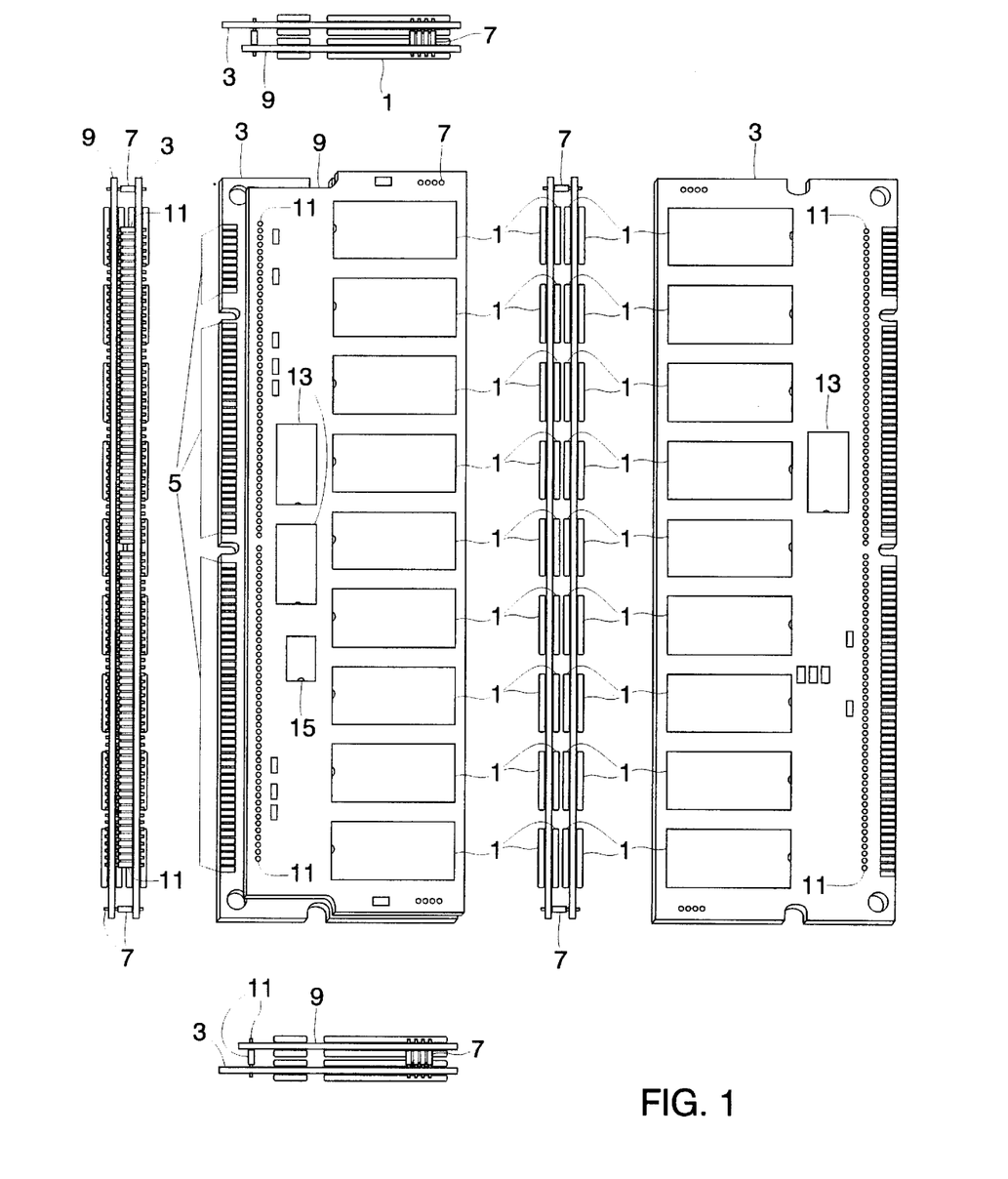
FIG. 1 is multi-view display of the preferred embodiment of the invention, with front, sides, bottom, and top views of a dual-stacked, DIMM chipset, PCB memory module.

Referring now to FIG. 1, the preferred embodiment of a high-speed, multiple-bank, stacked, and PCB-mounted memory module has a main, or mother bank comprised of a printed-circuit board (3) that is connected to at least one daughter bank comprised likewise of a printed circuit board (9). These banks are physically joined by readily-connecting, snap-in pins (7) that both support and maintain a fixed separation between the boards for cooling airflow, and by control and I/O connecting pins (11), through which control and data are shared amongst the banks. There are 9 individual in-line memory chips (1) are placed on each side of the mother bank (3) where the edge connector with 168 pin contacts for linking to the computer system (5) is at the bottom, while the connecting and supporting pins (7) at each of the four corners link the mother bank to the daughter bank (9), as do the shared control and I/O connectors (11) near the bottom of both banks. Control (13), clock (15) and subordinate function chips monitor and manage the information and control flow between the edge connector, the banks, and the individual memory chips.

The chips shown mounted on the boards are electrically connected typically through conductive mounting pads, which provide an extended conductive area to allow good, reliable, and constant contact between the pins of the computer chips and the leads on the substrates of the printed circuit boards.

Figure 2:
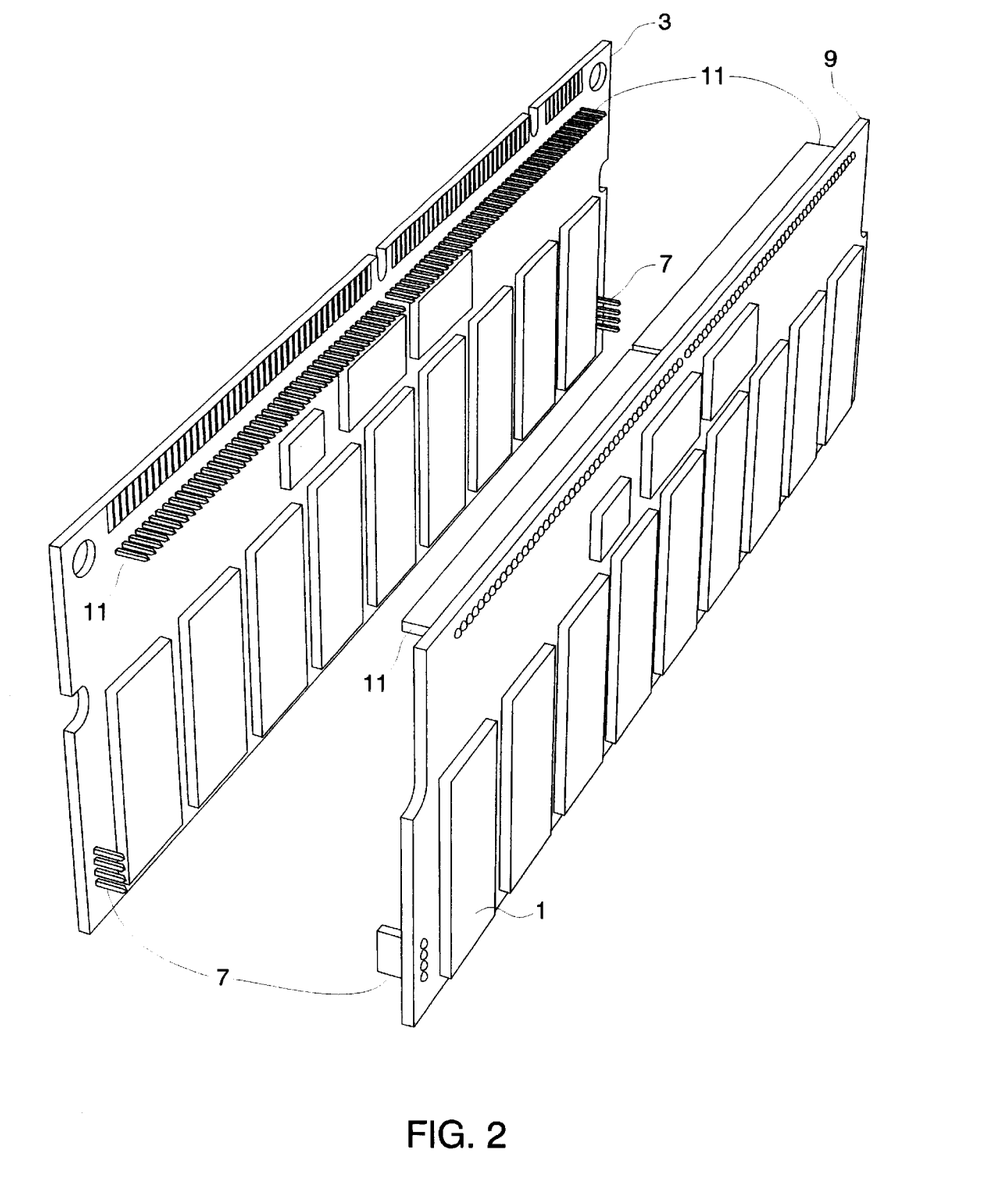
FIG. 2 is an exploded view of the same, from the bottom edge and right side.

FIG. 2 is an exploded view, from the bottom edge, of the mother bank (3) and the daughter bank (9), showing the shared control and I/O connectors (11) which have male and female aspects to ensure easy and secure joinder of the mother and daughter banks. Also displayed are the supporting pins (7) which similarly have male and female aspects to ensure easy and secure joinder of the mother and daughter banks. These connecting and supporting pins also keep the mother and daughter bank from contacting each other (while being placed on the motherboard, or if the computer is jarred or moved); they also ensure that distance is maintained that allows cooling (conductive, if there is airflow, or radiant) for a given chip density, which is not the case when the chips are stacked directly atop each other.

Figure 3:
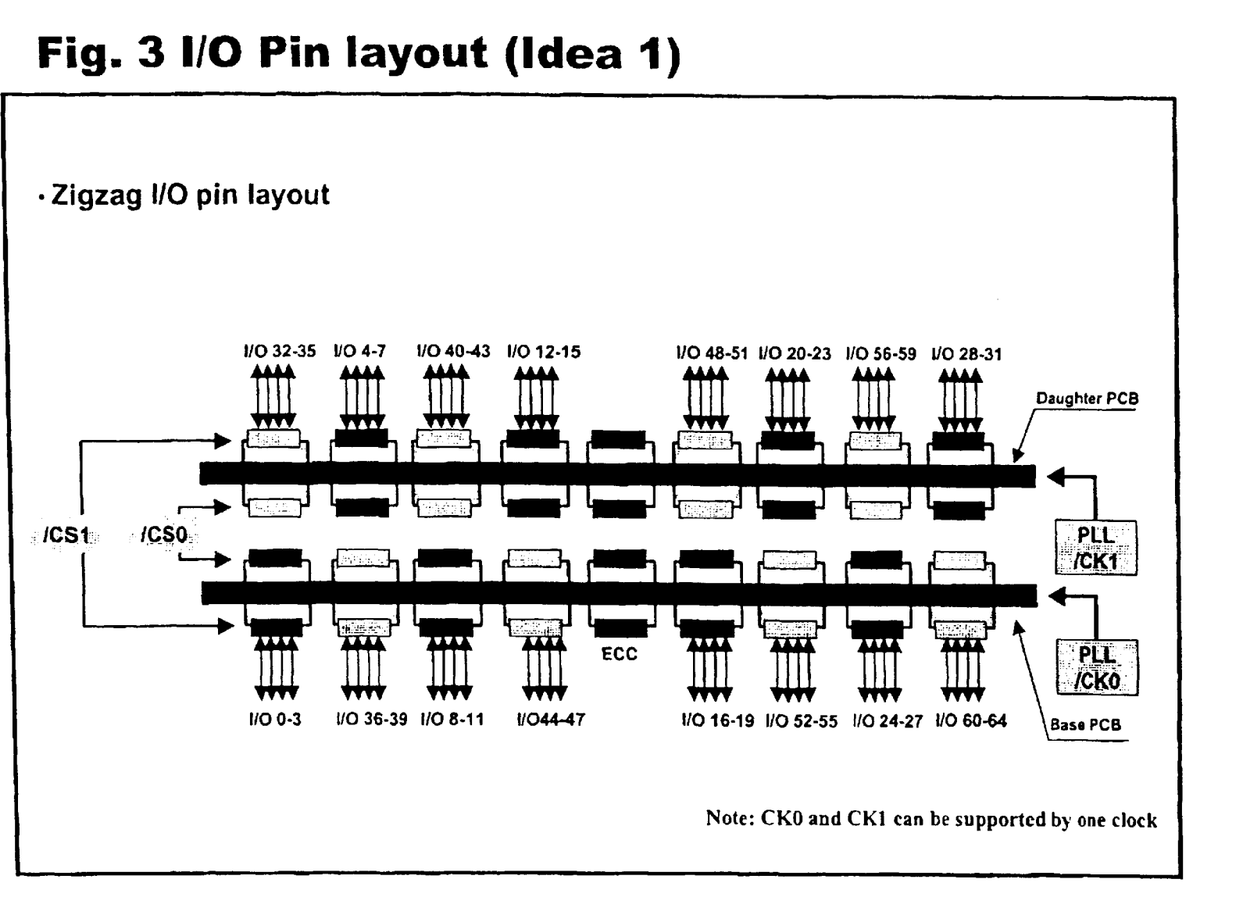
FIGS. 3–5 are alternative on-board Input/Output (I/O) layout for the pins of the individual RAM memory chips.
Figure 4:
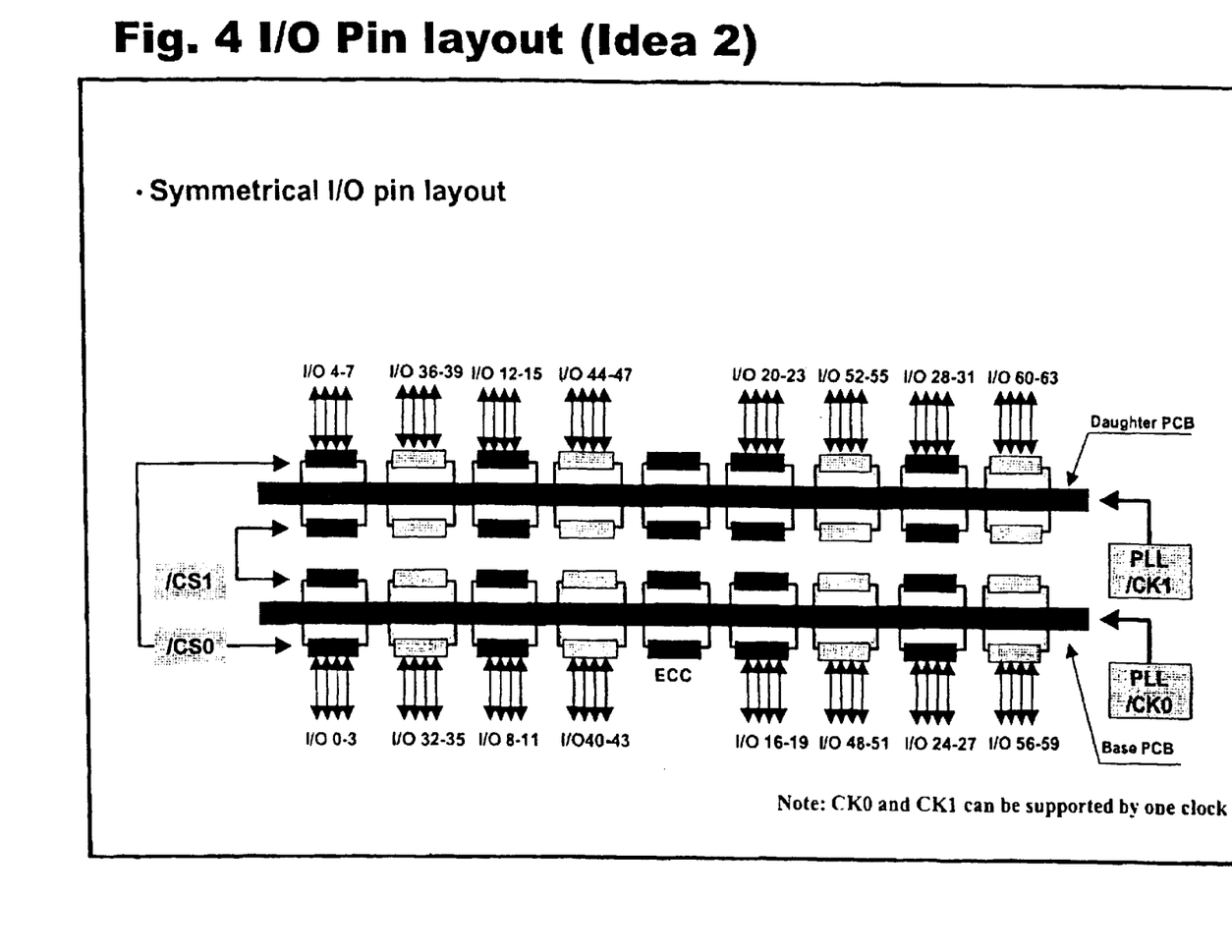
Figure 5:
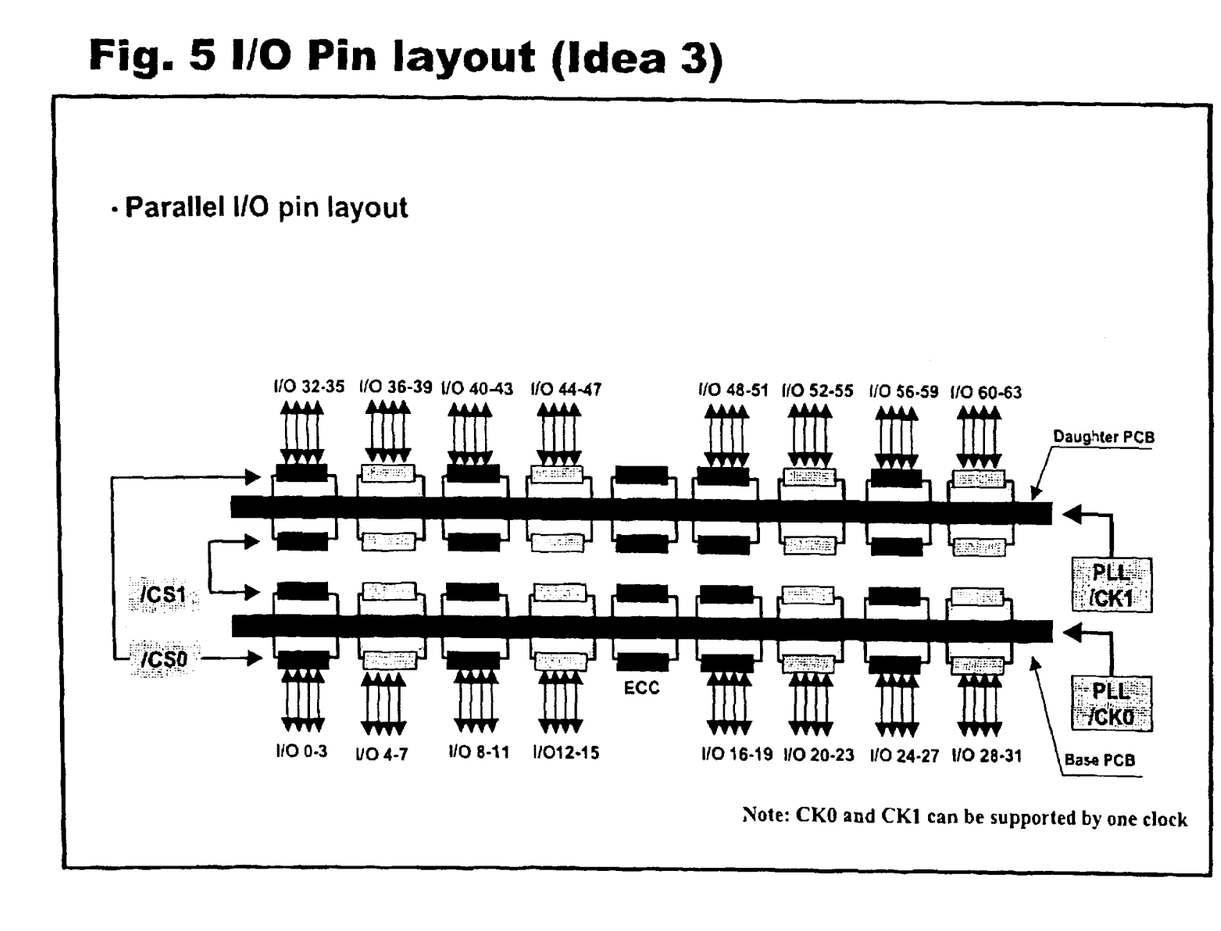

The entire memory module connects to the rest of the computer system and the computer bus through a standard edge connector (5) located at the bottom edge of the mother bank. Each of the individual boards have mounted, on each side, a set of industry-standard, in-line RAM memory chips (which, as they are mounted on both sides of each board in the preferred embodiment, are DIMMs) which comprise the RAM for the entire memory module. Mounted also on the main board are controller (13) and clock (15) chips that direct the I/O flow to the particular memory chip on the particular memory bank according to any of a number of memory and pin layouts. Memory addresses in the individual RAM chips can be sequentially zig-zagged (FIG. 3), symmetrical (FIG. 4), or parallel (FIG. 5). The controller chip (15) and clock (13) direct the memory flow between the system and the chips according to the pin layout scheme of the PCB. Not shown, but standard to the industry, are the printed circuit leads (which are why the mother and daughter banks are called 'printed circuit boards') that connect each pin of the edge connector (5) with a particular I/O pin of the shared control and I/O connector linking the two banks (9) and a particular I/O pin of one of the memory chips (1) (collectively, the I/O memory leads), and connecting the memory leads with the clock (15) and controller (13) chips, which direct the data input or output instructed by the CPU to the memory addressed in the combined rows and columns of the paired banks. These lines are DATA LINES, ADDRESS LINES, and CONTROL LINES, and the banks share the total number of these lines that connect to the edge connector between them. Half of the DATA LINES and ADDRESS LINES are shared equally between the mother and daughter banks; the controller (13) directing data between the two banks is required.

Keeping the total wire length short between the CPU and the RAM chips reduces the capacitance that must be overcome by the system (and lowers the power drain and heat production for a given clock and memory speed), as is well known in the industry. Because the maximum distance between any pair of banks is less than the distance between any pair of memory modules, the transmission time within a module due to the printed circuit length will necessarily be less than the transmission time from the system to a second module; however, the CPU and/or system may use any addressing scheme to maximize bus throughput in this embodiment of the invention. Thus one of the benefits of this embodiment of the invention is reducing the total capacitance needed for a given total amount of memory by reducing the distance between the banks containing said memory.

Because the memory is shared between the banks, for any one transfer (in or out) half of any transfer will be directed to the chips on the mother bank, and half will be directed to the chips on the daughter bank. This effectively doubles the addressable length within any given row. Because the connector lines need run only the horizontal distance between the banks through the I/O connectors (11), rather than the vertical distance to a separate card, the transmission time is shortened and more readily kept within the increasingly short clock cycles of the CPU, and system. Additionally, because the lines between the I/O connectors are spread between the surface area of two banks, rather than run or between each other or layered directly atop each other as when the chips are stacked directly atop one another, there is less cross-lead interference (thermal or electronic). Memory addressing schemata: used to fill the banks can address the longer length sequentially rather than serially, thereby reducing the number of row-advancing or row-reducing calls that the system must make to fill or empty the banks.

It will be apparent that further stacking is possible an dthat improvements and modifications may be made within the purview of the invention without departing from spirit and scope of the invention defined in the appended claims.

What is claimed is:

1. A device for increasing random access memory density for a computer for a given generation of Random Access Memory chips each having a plurality of connecting pins, comprising:

a first printed circuit board, having a front side, a back side, an edge connector on its bottom edge, a first part of an I/O connector to a second printed circuit board, a clock, an I/O controller, a plurality of supporting connectors, and a plurality of Random Access Memory chips mounted on said first printed circuit board;

said second printed circuit board having a front side, a back side, a second part of said I/O connector to said first printed circuit board that engages said first part of an I/O connector, a connector to a clock circuit, a connector to said I/O controller, attachments for a plurality of supporting connectors, and a plurality of Random Access Memory chips mounted on said second printed circuit board, said second printed circuit board being physically attached to said first printed circuit board by both said I/O connector and said supporting connectors;

a pin layout and printed circuit leads on each said printed circuit board for said plurality of memory chips providing a unique input and output connection through said printed circuit leads between each pin of each said memory chip and said edge connector sufficient to address each separable memory address of said memory chips;

each said printed circuit board also having printed circuit leads connecting through said I/O connector and said I/O controller in such fashion that one half (½) of said I/O leads are shared by both printed circuit boards and are controlled by said I/O controller;

a connection between said clock circuit, said I/O controller, and each memory chip providing timing control for all operations; and, circuitry within said I/O controller enabling or disabling access to each of said first printed circuit board and second printed circuit board, said I/O controller further selecting the memory chip upon the selected printed circuit board to activate and connect to said edge connector, for a particular I/O operation requested by the computer.

2. A device as in claim 1, wherein the pin layout for said plurality of memory chips providing a unique input and output connection to each said memory chip is parallel between said first printed circuit board and said second printed circuit board.

3. A device as in claim 1, wherein the pin layout for said plurality of memory chips providing a unique input and output connection to each said memory chip is symmetrical between said first printed circuit board and said second printed circuit board.

4. A device as in claim 1, wherein the pin layout for said plurality of memory chips providing a unique input and output connection to each said memory chip is zigzag between said first printed circuit board and said second printed circuit board.

5. A device for increasing random access memory density for a computer for a given generation of Random Access Memory chips each having a plurality of connecting pins, comprising:

a first printed circuit board, having a front side, a back side, an edge connector on its bottom edge, a first part of an I/O connector to a second printed circuit board, a clock, an I/O controller, a plurality of supporting connectors, and a plurality of pairs of Random Access Memory chips mounted on said first printed circuit board such that one element of each pair of memory components is stacked atop a second element of each pair;

said second printed circuit board having a front side; a back side, a second part of said I/O connector to said first printed circuit board that engages said first part of an I/O connector, a connector to a clock circuit, a connector to said I/O controller, attachments for a plurality of supporting connectors, and a plurality of pairs of Random Access Memory chips mounted on said second printed circuit board such that one element of each pair of memory components is stacked atop a second element of each pair, said second printed circuit board being physically attached to said first printed circuit board by both said I/O connector and said supporting connectors;

a pin layout and printed circuit leads on each said printed circuit board for said plurality of pairs of memory chips providing a unique input and output connection through said printed circuit leads between each pin of each said memory chip and said edge connector sufficient to address each separable memory address of said memory chips;

each said printed circuit board also having printed circuit leads connecting through said I/O connector and said I/O controller in such fashion that one half (½) of said I/O leads are shared by both printed circuit boards and are controlled by said I/O controller;

a connection between said clock circuit, said I/O controller, and each memory chip providing timing control for all operations; and, circuitry within said I/O controller enabling or disabling access to each of said first printed circuit board and second printed circuit board, said I/O controller further selecting the memory chip upon the selected printed circuit board to activate and connect to said edge connector, for a particular I/O operation requested by the computer.

6. A method for increasing random access memory density and speed for a computer, comprising:

using a device as set forth in claim 1 for memory operations;

sending a signal to said I/O controller register and clock, while accessing a particular memory chip on a particular bank, that precharge a different bank and memory chip for the next memory operation; and, allowing the memory chip and bank selection to change with every clock cycle.

* * * * *